US012690353B2

(12) United States Patent (10) Patent No.: US 12,690,353 B2

Kim (45) Date of Patent: Jul. 21, 2026

(54) LIGHT EMITTING DISPLAY DEVICE

(71) Applicant: LG Display Co., Ltd., Seoul (KR)

(72) Inventor: Kwang Hyun Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 303 days.

(21) Appl. No.: 18/359,195

(22) Filed: Jul. 26, 2023

(65) Prior Publication Data

US 2024/0260370 A1 Aug. 1, 2024

(30) Foreign Application Priority Data

Jan. 31, 2023 (KR) ........................ 10-2023-0012823

(51) Int. Cl.
H10K 59/35 (2023.01)
H10K 50/15 (2023.01)
*H10K 59/12* (2023.01)

(52) U.S. Cl.
CPC ......... H10K 59/353 (2023.02); H10K 50/156 (2023.02); *H10K 59/12* (2023.02)

(58) Field of Classification Search
CPC .... H10K 59/353; H10K 50/156; H10K 59/12; H10K 50/19; H10K 59/80; H10K 50/13
See application file for complete search history.

(56) References Cited

U.S. PATENT DOCUMENTS

2010/0155711 A1 6/2010 Hasegawa et al.
2014/0001447 A1 1/2014 Kim et al.

| 2017/0125736 A1* | 5/2017 | Kim ...................... H10K 50/852 |
| 2017/0194388 A1 | 7/2017 | Kim |
| 2017/0237031 A1 | 8/2017 | Kim et al. |
| 2018/0247981 A1 | 8/2018 | Yamaoka et al. |
| 2020/0006443 A1 | 1/2020 | Park et al. |
| 2020/0075686 A1 | 3/2020 | Yamaoka et al. |
| 2020/0176530 A1* | 6/2020 | Baek ...................... H10K 85/00 |
| 2020/0266373 A1 | 8/2020 | Kim et al. |
| 2021/0151518 A1 | 5/2021 | Park et al. |

(Continued)

FOREIGN PATENT DOCUMENTS

| JP | 2010-287524 A | 12/2010 |
| KR | 10-2015-0066734 A | 6/2015 |

(Continued)

*Primary Examiner* — Donald L Raleigh

(74) *Attorney, Agent, or Firm* — Birch, Stewart, Kolasch & Birch, LLP

(57) ABSTRACT

A light emitting display device including a substrate including a first subpixel, a second subpixel, and a third subpixel; a red light emitting element at the first subpixel, the red light emitting element comprising a red light emitting layer; a green light emitting element at the second subpixel, the green light emitting element comprising a green light emitting layer; and a blue light emitting element at the third subpixel, the blue light emitting element comprising a blue light emitting layer. In addition, a first wavelength difference between a photoluminescence peak and an electroluminescence peak of the red light emitting element is 2 nm or less, a second wavelength difference between a photoluminescence peak and an electroluminescence peak of the green light emitting element is 2 nm or less, and a third wavelength difference between a photoluminescence peak and an electroluminescence peak of the blue light emitting element is 2 nm or less.

15 Claims, 10 Drawing Sheets

(56)　　　　　References Cited

U.S. PATENT DOCUMENTS

2022/0208896 A1　6/2022　Kwak
2024/0065078 A1　2/2024　Kajimoto et al.

FOREIGN PATENT DOCUMENTS

KR　　10-2016074 B1　8/2019
KR　　10-2116414 B1　5/2020
KR　　10-2377032 B1　3/2022
TW　　202226213 A　　7/2022
WO　　2022/220111 A1　10/2022

* cited by examiner

DATA

12

DATA, DE

13

DDC

14

DL

GDC

GL    PD

SP

15

AA

11

16 → EVDD

→ EVSS

Red EL and PL Spectrum

FIG. 5

Green EL and PL Spectrum

FIG. 6

Blue EL and Spectrum

LIGHT EMITTING DISPLAY DEVICE

CROSS-REFERENCE TO RELATED APPLICATION

This application claims the benefit under 35 U.S.C. § 119(a) to Patent Application No. 10-2023-0012823, filed in the Republic of Korea on Jan. 31, 2023, which is hereby incorporated by reference into the present application.

BACKGROUND OF THE INVENTION

Field of the Invention

The present disclosure relates to a light emitting display device that prevents a white color deviation when a viewing angle changes and prevents an emission color deviation visibility.

Discussion of the Related Art

The demand for display devices that display images has increased. One type of display device includes a self-emitting light emitting display device that does not use a separate light source, and thus is slim, flexible, and has an excellent color purity.

The self-emitting display device includes a light emitting element with first and second electrodes and a light emitting layer provided therebetween. When electrons and holes respectively generated from the first and second electrodes are injected into the light emitting layer, the electrons and the holes are combined, whereby excitons are generated, and light is emitted as the generated excitons are lowered from an excited state to a ground state.

SUMMARY OF THE INVENTION

It is an object of the present disclosure to provide a light emitting display device capable of preventing color deviation of white depending on viewing angle change and/or preventing color deviation visibility for each emission color.

The light emitting display device includes different color light emitting layers corresponding to different subpixels. The subpixels also have different vertical distances between the opposite electrodes, whereby an outcoupling effect is induced. In addition, the light emitting elements having different light emitting layers are turned on to express a white color. In this instance, the degree of color deviation recognition is increased depending on a viewing angle change due to the vertical distance between the opposite electrodes in the adjacent subpixels when a white color is implemented.

One aspect of the present disclosure is to provide a light emitting display device that reduces or prevents a color deviation due to a viewing angle change when a white color is implemented and to provide stable vision.

To achieve these and other advantages and in accordance with the purpose of the present invention, as embodied and broadly described herein, the present invention provides in one aspect a light emitting display device including a substrate having first, second and third pixels respectively including red, green and blue light emitting elements. The red, green and blue light emitting elements respectively include red, green and blue light emitting layers. In addition, first wavelength difference between the photoluminescence peak and the electroluminescence peak of the red light emitting element is 2 nm or less, the second wavelength difference between the photoluminescence peak and the electroluminescence peak of the green light emitting element is 2 nm or less, and the third wavelength difference between the photoluminescence peak and the electroluminescence peak of the blue light emitting element is 2 nm or less.

White light obtained by summing the red light, the green light, and the blue light may have a color viewing angle distance of 0.010 or less at a viewing angle of 60° or less.

At a viewing angle of 60° or less, a maximum value of a first color viewing angle distance of red light from the red light emitting element may be largest, and a maximum value of a third color viewing angle distance of blue light from the blue light emitting element may be smallest.

The maximum value of the first color viewing angle distance may be generated at a viewing angle of 45° to 60°, and each of a maximum value of the second color viewing angle distance and the maximum value of the third color viewing angle distance may be generated at a viewing angle of 30° to 60°.

At the same viewing angle, each of a first color viewing angle distance of red light from the red light emitting element, a second color viewing angle distance of green light from the green light emitting element, and a third color viewing angle distance of blue light from the blue light emitting element may be greater than a fourth color viewing angle distance of white light obtained by summing the red light, the green light, and the blue light.

A first color viewing angle distance of red light from the red light emitting element may be greater than each of a second color viewing angle distance of green light from the green light emitting element and a third color viewing angle distance of blue light from the blue light emitting element at a viewing angle of more than 20° to 60°.

A first color viewing angle distance of red light from the red light emitting element may be less than each of a second color viewing angle distance of green light from the green light emitting element and a third color viewing angle distance of blue light from the blue light emitting element at a viewing angle of 0° to 20°.

Each of the red light emitting element, the green light emitting element, and the blue light emitting element further may comprise a first electrode and a second electrode opposite each other. The red light emitting layer, the green light emitting layer, and the blue light emitting layer may be respectively provided between the first electrode and the second electrode and have different vertical distances between the first electrode and the second electrode.

The red light emitting element, the green light emitting element, and the blue light emitting element may have different thicknesses.

A capping layer may be disposed on the second electrode. The second electrode may comprise a translucent electrode. The first electrode may comprise a reflective electrode.

The red light emitting layer may comprise a plurality of red light emitting layers stacked over each other at the first subpixel, and at least one common layer therebetween. The green light emitting layer may comprise a plurality of green light emitting layers stacked over each other at the second subpixel, and with the at least one common layer therebetween. The blue light emitting layer may comprise a plurality of blue light emitting layers stacked over each other at the third subpixel, and with the at least one common layer therebetween.

A first hole transport auxiliary layer may be provided between an uppermost one of the plurality of red light emitting layers and the at least one common layer. A second hole transport auxiliary layer may be provided between an uppermost one of the plurality of green light emitting layers and the at least one common layer.

The at least one common layer may comprise an electron transport layer, a charge generation layer, and a hole transport layer.

Each of the red light emitting element, the green light emitting element, and the blue light emitting element may comprise a first electrode, a hole injection layer on the first electrode, a hole transport layer on the hole injection layer, an electron transport layer on the respective one of the red light emitting layer, the green light emitting layer and the blue light emitting layer, and a second electrode on the electron transport layer. Each of the red light emitting layer, the green light emitting layer, and the blue light emitting layer may be provided between the hole transport layer and the electron transport layer.

A first hole transport auxiliary layer may be disposed between the hole transport layer and the red light emitting layer. A second hole transport auxiliary layer may be disposed between the hole transport layer and the green light emitting layer.

The first hole transport auxiliary layer may be thicker than the second hole transport auxiliary layer.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 1 is a block diagram schematically showing a light emitting display device according to an embodiment of the present disclosure;

FIG. 4 is a graph showing an electroluminescence (EL) spectrum and a photoluminescence (PL) spectrum of a red light emitting element in the light emitting display device according to an embodiment of the present disclosure;

FIG. 5 is a graph showing an electroluminescence (EL) spectrum and a photoluminescence (PL) spectrum of a green light emitting element in the light emitting display device according to an embodiment of the present disclosure;

FIG. 6 is a graph showing an electroluminescence (EL) spectrum and a photoluminescence (PL) spectrum of a blue light emitting element in the light emitting display device according to an embodiment of the present disclosure;

DETAILED DESCRIPTION OF THE INVENTION

Figure 2:
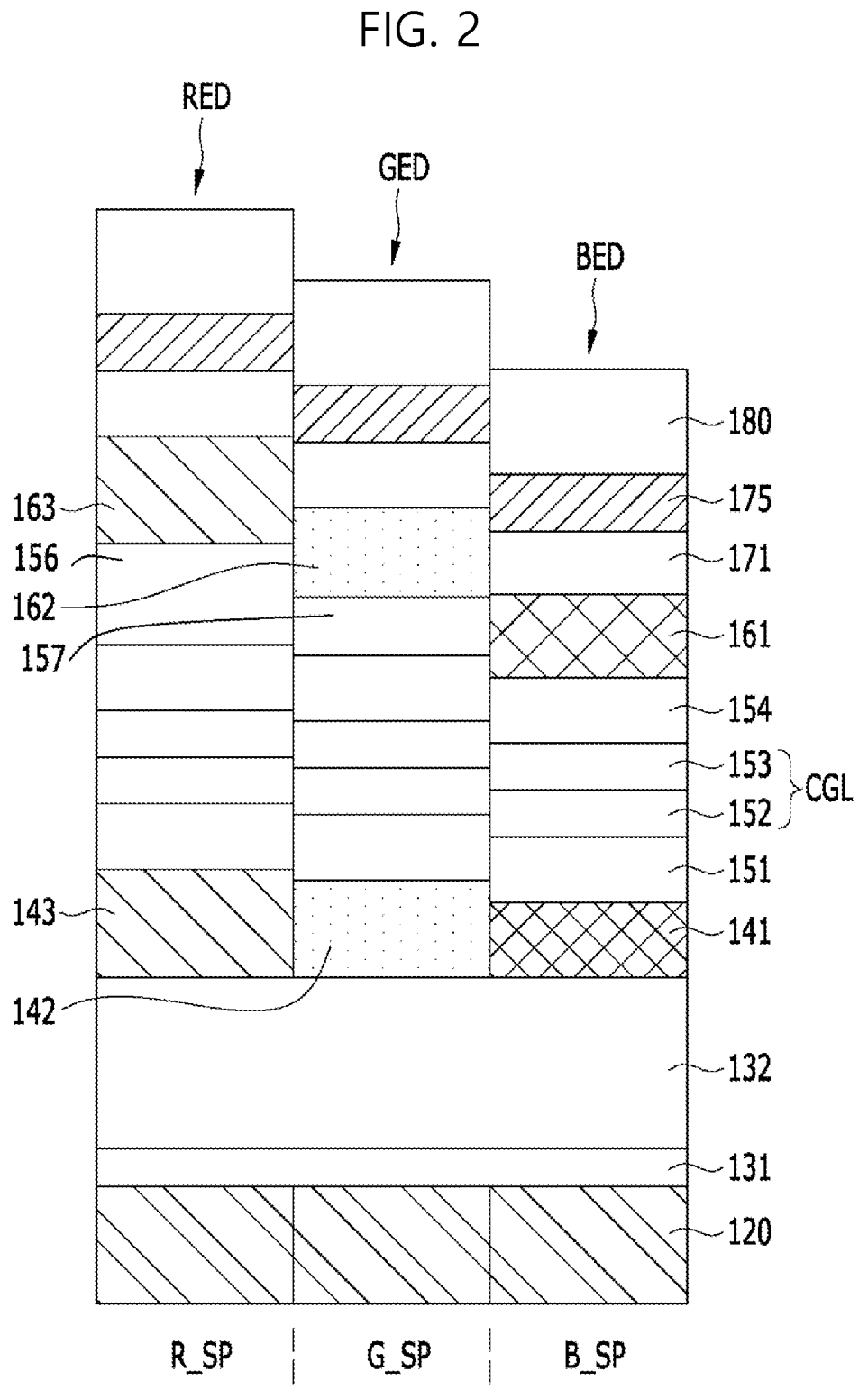
FIG. 2 is a sectional view showing light emitting elements of adjacent subpixels in a light emitting display device according to an embodiment of the present disclosure.

Hereinafter, preferred embodiments of the present disclosure will be described with reference to the accompanying drawings. Throughout the specification, the same reference numerals mean substantially the same elements. In the following description, a detailed description of known functions and configurations incorporated herein will be omitted when it can make the subject matter of the disclosure rather unclear. In addition, names of components used in the following description are selected in consideration of ease in preparing the specification, and can be different from names of parts of an actual product.

In the drawings for explaining various embodiments of the present disclosure, for example, the illustrated shape, size, ratio, angle, and number are given by way of example, and thus, are not limitative of the disclosure of the present disclosure. Throughout the specification, the same reference numerals designate the same constituent elements. The terms "comprises", "includes", and/or "has", used in the specification, do not preclude the presence or addition of other elements unless used along with the term "only." The singular forms are intended to include the plural forms as well unless the context clearly indicates otherwise.

In the interpretation of constituent elements included in the various embodiments of the present disclosure, the constituent elements are interpreted as including an error range even if there is no explicit description thereof. In the description of the various embodiments of the present disclosure, when describing positional relationships, for example, when the positional relationship between two parts is described using "on", "above", "below", "aside", or the like, one or more other parts may be located between the two parts unless the term "directly" or "closely" is used therewith.

In the description of the various embodiments of the present disclosure, when describing temporal relationships, for example, when the temporal relationship between two actions is described using "after", "subsequently", "next", "before", or the like, the actions may not occur in succession unless the term "immediately" or "directly" is used therewith. In the description of the various embodiments of the present disclosure, although terms such as, for example, "first" and "second" can be used to describe various elements, these terms are merely used to distinguish the same or similar elements from each other. Therefore, in the specification, an element modified by "first" may be the same as an element modified by "second" within the technical scope of the present disclosure unless mentioned otherwise.

The respective features of the various embodiments of the present disclosure can be partially or wholly coupled to and combined with each other, and various technical linkages therebetween and operation methods thereof are possible. These various embodiments can be performed independently of each other, or can be performed in association with each other.

In the specification, the term "doped" means that a material of any layer, which has physical properties (e.g., N-type and P-type, or an organic material and an inorganic material) different from the material that occupies the greatest weight percentage of the corresponding layer, is added to the material accounting for the greatest weight percentage in an amount corresponding to a weight percentage of less than 30%. In other words, a "doped" layer means a layer in which a host material and a dopant material of any layer are distinguishable from each other in consideration of the weight percentages thereof. In addition, the term "undoped" refers to all cases excluding the case that corresponds to the term "doped." For example, when any layer is formed of a single material or is formed of a mixture of materials having the same or similar properties, the layer is an "undoped" layer. For example, when at least one of constituent materials of any layer is of a P-type and not all of the other constituent materials of the layer are of an N-type, the layer is an "undoped" layer. When at least one of the constituent materials of any layer is an organic material and not all of the other constituent materials of the layer are an inorganic material, the layer is an "undoped" layer. Also, when all constituent materials of any layer are organic materials, at least one of the constituent materials is of an N-type, at least another constituent material is of a P-type, and the weight percent of the N-type material is less than 30% or the weight percent of the P-type material is less than 30%, the layer is a "doped" layer.

Further, in this specification, an electroluminescence (EL) spectrum is calculated via the product of (1) a photoluminescence (PL) spectrum that represents unique properties of an emissive material such as a dopant or host material included in an organic emissive layer and (2) an outcoupling emittance spectrum curve determined depending on the structure and optical properties of an organic light-emitting device including thicknesses of organic layers such as an electron transport layer.

Hereinafter, a light emitting display device according to an embodiment of the present disclosure and a method of manufacturing the same will be described with reference to the accompanying drawings.

Figure 1:
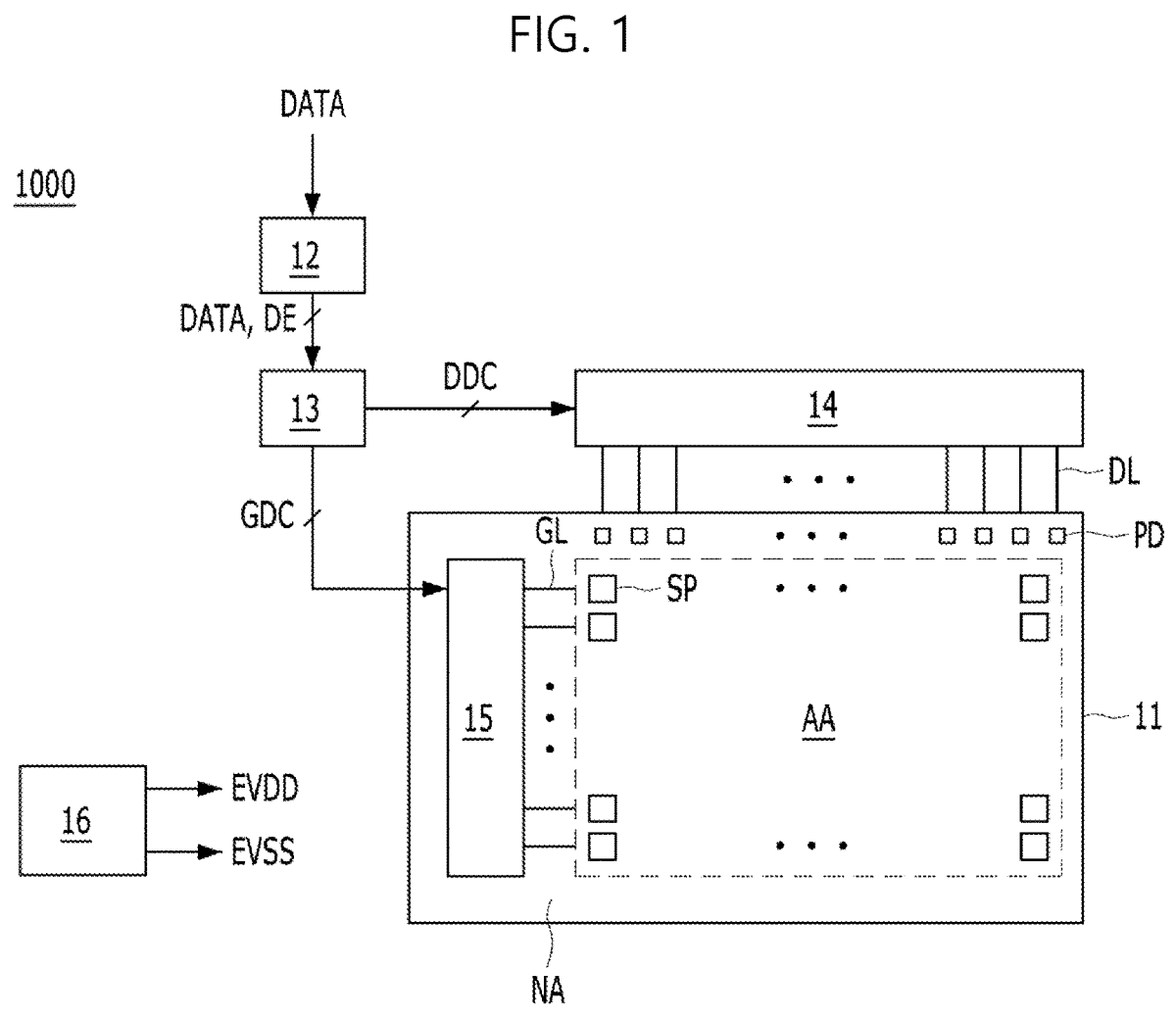

FIG. 1 is a block diagram schematically showing a light emitting display device 1000 according to an embodiment of the present disclosure. As shown in FIG. 1, the light emitting display device 1000 includes a display panel 11, an image processing unit 12, a timing controller 13, a data driving unit 14, a scan driving unit 15, and a power supply unit 16.

The display panel 11 displays an image according to a data signal DATA supplied from the data driving unit 14, a scan signal supplied from the scan driving unit 15, and power supplied from the power supply unit 16. As shown, the display panel 11 includes a subpixel SP disposed at each of intersections between a plurality of gate lines GL and a plurality of data lines DL. The structure of the subpixel SP can be variously changed depending on the kind of the light emitting display device 1000.

For example, the subpixel SP can be formed as a top emission type subpixel, a bottom emission type subpixel, or a dual emission type subpixel. The subpixel SP corresponds to a unit pixel having a specific kind of color filter or a unit pixel capable of emitting an assigned color of light without a color filter.

For example, subpixels SP can include a red subpixel, a green subpixel, and a blue subpixel. Alternatively, the subpixels SP can include a red subpixel, a blue subpixel, a white subpixel, and a green subpixel. The subpixels SP can also have one or more different light emission areas depending on light emission characteristics thereof. For example, the blue subpixel and the subpixels that emit different colors of light can have different light emission areas.

In addition, one or more subpixels SP can constitute one unit pixel. For example, one unit pixel can include red, green, and blue subpixels repeatedly disposed. Alternatively, one unit pixel can include red, green, blue, and white subpixels repeatedly disposed. Further, the red, green, blue, and white subpixels can be disposed in a quad structure. In the present disclosure, the color type, disposition type, and disposition sequence of the subpixels can be variously configured depending on light emission characteristics, the lifespan of the element, and the specifications of the device, and the present disclosure is not limited thereto.

As shown in FIG. 1, the display panel 11 can be divided into an active area AA (interior of a dotted area) in which the subpixels SP are disposed to display an image and a non-active area NA around the active area AA. Further, the scan driving unit 15 can be mounted in the non-active area NA of the display panel 11. In addition, a pad unit including a pad electrode PD can be provided in the non-active area NA. Here, the active area AA and the non-active area NA can also be respectively referred to as a display area and a non-display area.

Further, the image processing unit 12 outputs the data signal DATA supplied from the outside and a data enable signal DE, and the image processing unit 12 outputs at least one of a vertical synchronization signal, a horizontal synchronization signal, and a clock signal, in addition to the data enable signal DE.

Further, the timing controller 13 receives a driving signal and the data signal DATA from the image processing unit 12. The driving signal can include the data enable signal DE. Alternatively, the driving signal can include the vertical synchronization signal, the horizontal synchronization signal, and the clock signal. Also, the timing controller 13 outputs a data timing control signal DDC for controlling operation timing of the data driving unit 14 and a gate timing control signal GDC for controlling operation timing of the scan driving unit 15 based on the driving signal.

The data driving unit 14 can sample, latch, and convert the data signal DATA supplied from the timing controller 13 into a gamma reference voltage and output the gamma reference voltage in response to the data timing control signal DDC supplied from the timing controller 13. The data driving unit 14 also outputs the data signal DATA through the data lines DL and can be implemented in the form of an integrated circuit (IC). The data driving unit 14 can also be electrically connected to the pad electrode PD disposed in the non-active area NA of the display panel 11 via a flexible circuit film.

In addition, the scan driving unit 15 outputs the scan signal in response to the gate timing control signal GDC supplied from the timing controller 13. The scan driving unit 15 can output the scan signal through the gate lines GL and can be implemented in the form of an integrated circuit (IC) or in the form of a gate in panel (GIP) in the display panel 11.

In addition, the power supply unit 16 can output a high-potential voltage and a low-potential voltage for driving the display panel 11. In particular, the power supply unit 16 can supply the high-potential voltage to the display panel 11 via a first power line EVDD (a driving power line or a pixel power line), and can supply the low-potential voltage to the display panel 11 via a second power line EVSS (an auxiliary power line or a common power line).

As described above, the display panel 11 can be divided into the active area AA and the non-active area NA, and can include the plurality of subpixels SP defined by the gate lines GL and the data lines DL intersecting each other in a matrix form in the active area AA. The subpixels SP can include subpixels configured to emit at least two of red light, green light, blue light, yellow light, magenta light, and cyan light. In addition, each of the plurality of subpixels SP can have a specific kind of color filter or can emit an assigned color of light without a color filter. However, the present disclosure is not limited thereto, and the color, disposition type, and disposition sequence of the subpixels SP can be variously configured depending on light emission characteristics, the lifespan of the element, and the specifications of the device. Each of the subpixels SP can include a light emitting portion configured to emit light and a light non-emitting portion around the light emitting portion.

Hereinafter, a light emitting display device according to an embodiment of the present disclosure will be described with reference to the drawings. In particular, FIG. 2 is a sectional view showing light emitting elements of adjacent subpixels in a light emitting display device according to an embodiment of the present disclosure, and FIG. 3 is a sectional view showing a light emitting display device having the light emitting elements of FIG. 2 applied thereto.

Figure 3:
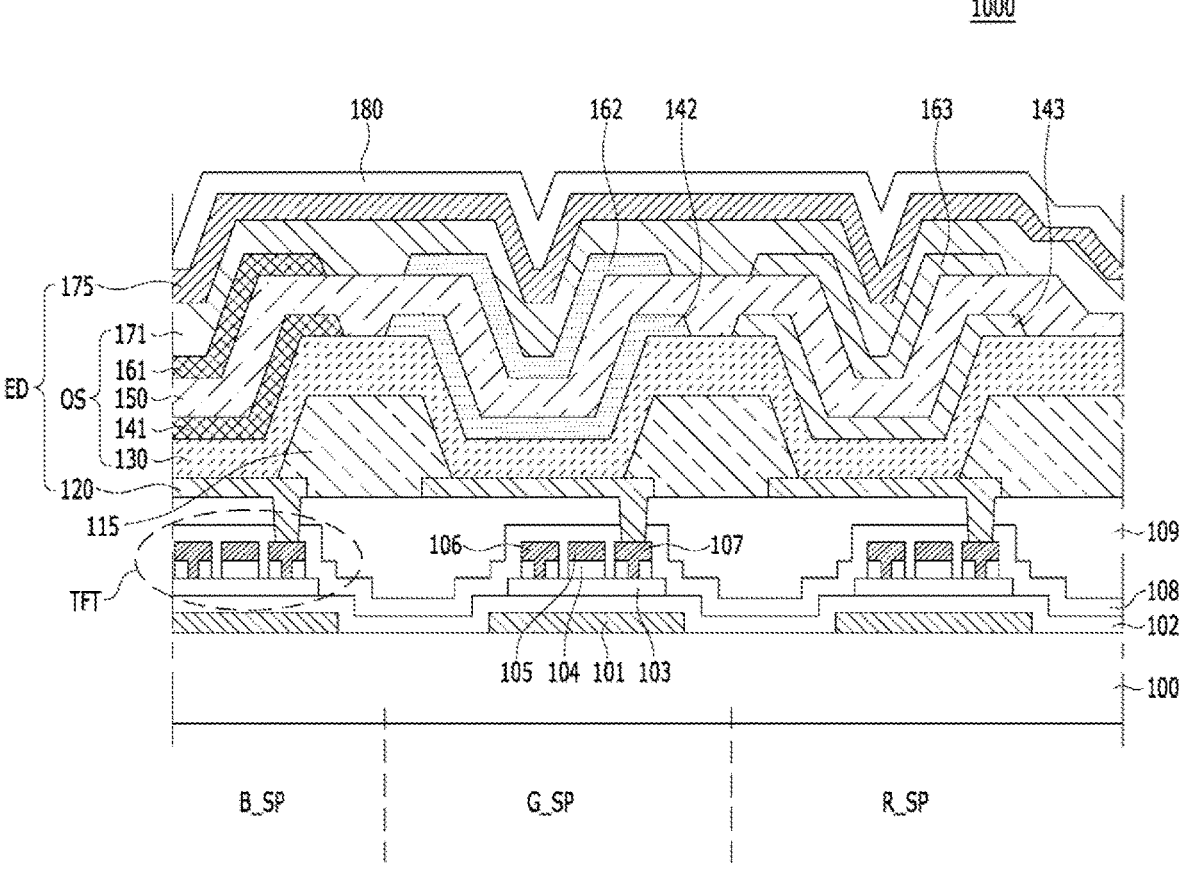
FIG. 3 is a sectional view showing a light emitting display device having the light emitting elements of FIG. 2 applied thereto.

Referring to FIGS. 2 and 3, the light emitting display device 1000 according to the embodiment of the present disclosure includes a substrate 100 including a first subpixel R_SP, a second subpixel G_SP, and a third subpixel B_SP and light emitting elements RED, GED, and BED provided in the respective subpixels on the substrate. More specifically, the light emitting display device 1000 includes a red light emitting element RED provided in a first subpixel R_SP, a green light emitting element GED provided in a second subpixel G_SP, and a blue light emitting element BED provided in a third subpixel B_SP. Further, the red light emitting element RED includes first and second red light emitting layers 143 and 163; the green light emitting element GED includes first and second green light emitting layers 142 and 162; and the blue light emitting element BED includes first and second blue light emitting layers 141 and 161.

In the light emitting display device shown in FIGS. 2 and 3, each of the light emitting elements RED, GED, and BED includes a charge generation layer CGL provided between first and second electrodes 120 and 175, a lower stack provided between the first electrode 120 and the charge generation layer CGL, and an upper stack provided between the charge generation layer CGL and the second electrode 175. A bank 115 may be disposed between the first electrodes 120 of two adjacent light emitting elements RED, GED and BED. Specifically, the red light emitting element RED includes a charge generation layer CGL provided between the first electrode 120 and the second electrode 175 and two stacks divided by the charge generation layer CGL. The lower stack of the red light emitting element RED includes a hole injection layer 131, a first hole transport layer 132, a first red light emitting layer 143, and a first electron transport layer 151. The upper stack of the red light emitting element RED includes a second hole transport layer 154, a first hole transport auxiliary layer 156, a second red light emitting layer 163, and a second electron transport layer 171.

In addition, the lower stack of the green light emitting element GED of FIG. 2 includes a hole injection layer 131, a first hole transport layer 132, a first green light emitting layer 142, and a first electron transport layer 151. The upper stack of the green light emitting element GED includes a second hole transport layer 154, a second hole transport auxiliary layer 157, a second green light emitting layer 162, and a second electron transport layer 171.

The lower stack of the blue light emitting element BED of FIG. 2 includes a hole injection layer 131, a first hole transport layer 132, a first blue light emitting layer 141, and a first electron transport layer 151. The upper stack of the blue light emitting element BED includes a second hole transport layer 154, a second blue light emitting layer 161, and a second electron transport layer 171.

Further, the first and second red light emitting layers 143 and 163 overlap each other (or are stacked on each other) in the first subpixel R_SP, the first and second green light emitting layers 142 and 162 overlap each other (or are stacked on each other) in the second subpixel G_SP, and the first and second blue light emitting layers 141 and 161 overlap each other (or are stacked on each other) in the third subpixel B_SP. In addition, a charge generation layer CGL including an n-type charge generation layer 152 and a p-type charge generation layer 153 is further provided between the lower stack and the upper stack. In particular, the n-type charge generation layer 152 generates electrons and supplies the electrons to the lower stack, and the p-type charge generation layer 153 generates holes and supplies the holes to the upper stack. Depending on circumstances, the n-type charge generation layer 152 and the p-type charge generation layer 153 can be formed as a single layer.

In addition, the layers provided between the first electrode 120 and the second electrode 175 are referred to as an intermediate layer OS (see FIG. 3), and each of the layers included in the intermediate layer OS can be formed so as to include an inorganic material. Some of the layers can include an inorganic material as a small amount of dopant for electron transportability, hole transportability, mobility, or light emission control.

Further, in the light emitting display device according to the embodiment of the present disclosure, at least one of or all of the hole injection layer 131, the first hole transport layer 132, the first electron transport layer 151, the charge generation layer CGL, the second hole transport layer 154, and the second electron transport layer 171 are commonly provided in each of the light emitting elements RED, GED, and BED, and can also be referred to as common layers.

In addition, as shown in FIG. 2, for example, the red light emitting element RED, the green light emitting element GED, and the blue light emitting element BED have different vertical distances between the first electrode 120 and the second electrode 175, whereby outcoupling characteristics change depending on the wavelength of each emission color. To change the vertical distance between the first electrode 120 and the second electrode 175, the red light emitting element RED may include a first hole transport auxiliary layer 156 and the green light emitting element GED can include a second hole transport auxiliary layer 157. The first hole transport auxiliary layer 156 and the second hole transport auxiliary layer 157 may have different thicknesses.

Here, the first and second hole transport auxiliary layers 156 and 157 can be disposed in any one of the lower and upper stacks stack, and can be disposed so as to abut the respective hole transport layers in the lower stack and the upper stack. FIG. 2 illustrates an example in which the first and second hole transport auxiliary layers 156 and 157 are disposed in the upper stack. The first and second hole transport auxiliary layers 156 and 157 can also be made of an organic material having identical or similar energy band gap characteristics to the first and second hole transport layers 132 and 154. However, the present disclosure is not limited thereto.

Further, in the light emitting display device according to the embodiment of the present disclosure, the first electrode 120 can include a reflective electrode, and the second electrode 175 can be a translucent electrode or a transparent electrode. FIGS. 2 and 3 further illustrate a capping layer 180 configured to protect the red light emitting element RED, the green light emitting element GED, and the blue light emitting element BED and to improve exit efficiency of light emitted from the second electrode 175 can be further provided on the second electrode 175. The capping layer 180 can include at least one of an organic capping layer and an inorganic capping layer. To maximize a discharge efficiency, the capping layer 180 can include a plurality of capping layers having different refractive indexes.

When the light emitting element is a top emission type light emitting element, the first electrode 120 can include a reflective electrode, and the second electrode 175 can include a transparent electrode or a transflective electrode. For example, when the first electrode 120 includes a reflective electrode, the first electrode 120 can be formed in a multilayer structure including a transparent conductive film and an opaque conductive film that exhibits high reflection efficiency. The transparent conductive film of the first electrode 120 can be made of a material that has a relatively large work function, such as indium tin oxide (ITO) or indium zinc oxide (IZO), and the opaque conductive film can be formed in a single layer structure or a multilayer structure made of any one selected from the group consisting of silver (Ag), magnesium (Mg), aluminum (Al), copper (Cu), molybdenum (Mo), titanium (Ti), nickel (Ni), chromium (Cr), and tungsten (W) or an alloy thereof. For example, the first electrode 120 can be formed in a structure in which a transparent conductive film, an opaque conductive film, and a transparent conductive film are sequentially stacked or a structure in which a transparent conductive film and an opaque conductive film are sequentially stacked. As an example, the first electrode 120 can include a stack structure of ITO/APC(Ag—Pd—Cu)/ITO.

In addition, the second electrode 175 can be made of a transparent conductive material, such as indium tin oxide (ITO) or indium zinc oxide (IZO), or can be made of silver (Ag), aluminum (Al), magnesium (Mg), calcium (Ca), ytterbium (Yb), or an alloy including at least one thereof, which has a small thickness sufficient to transmit light. When the second electrode 175 is made of a metal or a metal alloy having a small thickness sufficient to transmit light, the second electrode 175 can be transflective, whereby light resonated between the first electrode 120 and the second electrode 175 can have strong cavity characteristics and be transmitted through the second electrode 175.

Further, in the light emitting display device according to the embodiment of the present disclosure, the thicknesses of the first and second red light emitting layers 143 and 163, the first and second green light emitting layers 142 and 162, and the first and second blue light emitting layers 141 and 161 can be different from each other, whereby the optical distance can be changed.

Each of the red light emitting element RED, the green light emitting element GED, and the blue light emitting element BED also includes a first electrode 120 and a second electrode 175 opposite each other, and the first and second red light emitting layers 143 and 163, the first and second green light emitting layers 142 and 162, and the first and second blue light emitting layers 141 and 161 are provided between the first electrode 120 and the second electrode 175. Also, the red light emitting element RED, the green light emitting element GED, and the blue light emitting element BED have different vertical distances between an inner surface of the first electrode 120 (surface abutting the hole injection layer 131) and an inner surface of the second electrode 175 (surface abutting the electron transport layer 171), whereby it is possible to obtain the maximum outcoupling characteristics of each emission color due to the difference in vertical distance between the first and second electrodes 120 and 175.

In addition, the maximum outcoupling characteristics can be obtained from conditions in which light generated from the light emitting layers provided between the first and second electrodes 120 and 175 is reflected and re-reflected by the inner surfaces of the first and second electrodes 120 and 175 and exits to the maximum through constructive interference. The red light emitting element RED has a maximum light emission peak at a wavelength of 600 nm to 650 nm, the green light emitting element GED has a maximum light emission peak at a wavelength of 500 nm to 590 nm, and the blue light emitting element BED has a maximum light emission peak at a wavelength of 420 nm to 490 nm. That is, the red, green and blue light emitting elements have different wavelengths at which the maximum light emission peak is generated, and therefore the vertical distances between the first and second electrodes 120 and 175 required for outcoupling characteristics through constructive interference are different from each other. Here, the maximum light emission peak may denote the peak of maximum intensity of light emitted by the respective light emitting element.

In a structure in which the color of a subpixel is expressed using different color light emitting layers for each subpixel, a light emitting element having a difference in vertical distance between the first and second electrodes is included, whereby outcoupling characteristics in a front structure are improved; however the viewing angle is sensitively changed, and therefore a color difference visibility problem occurs. The light emitting display device according to an embodiment of the present disclosure solves the color deviation depending on the viewing angle change and particularly prevents a color change for each viewing angle occurring during a white color implementation.

Figure 4:
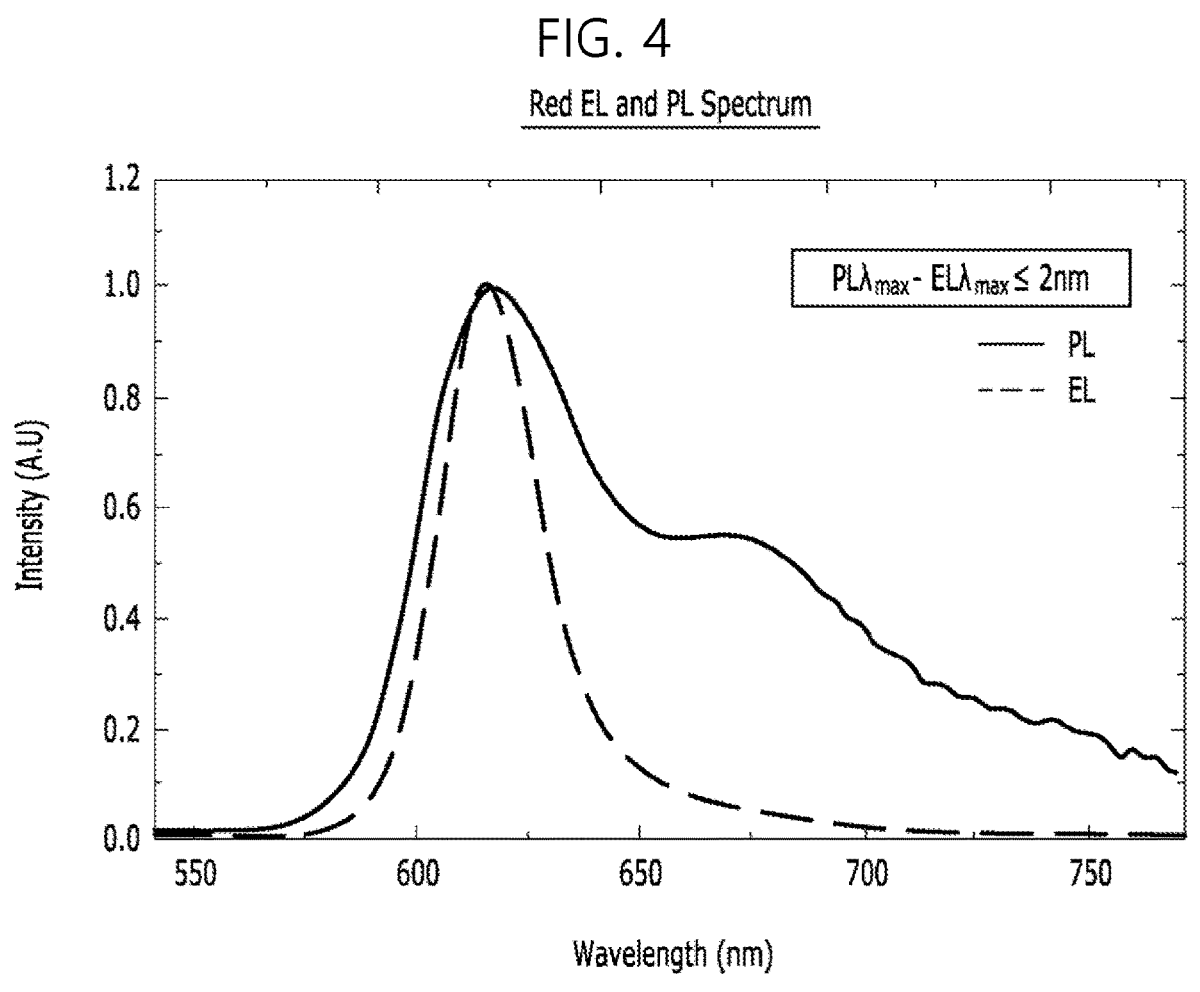
Figure 5:
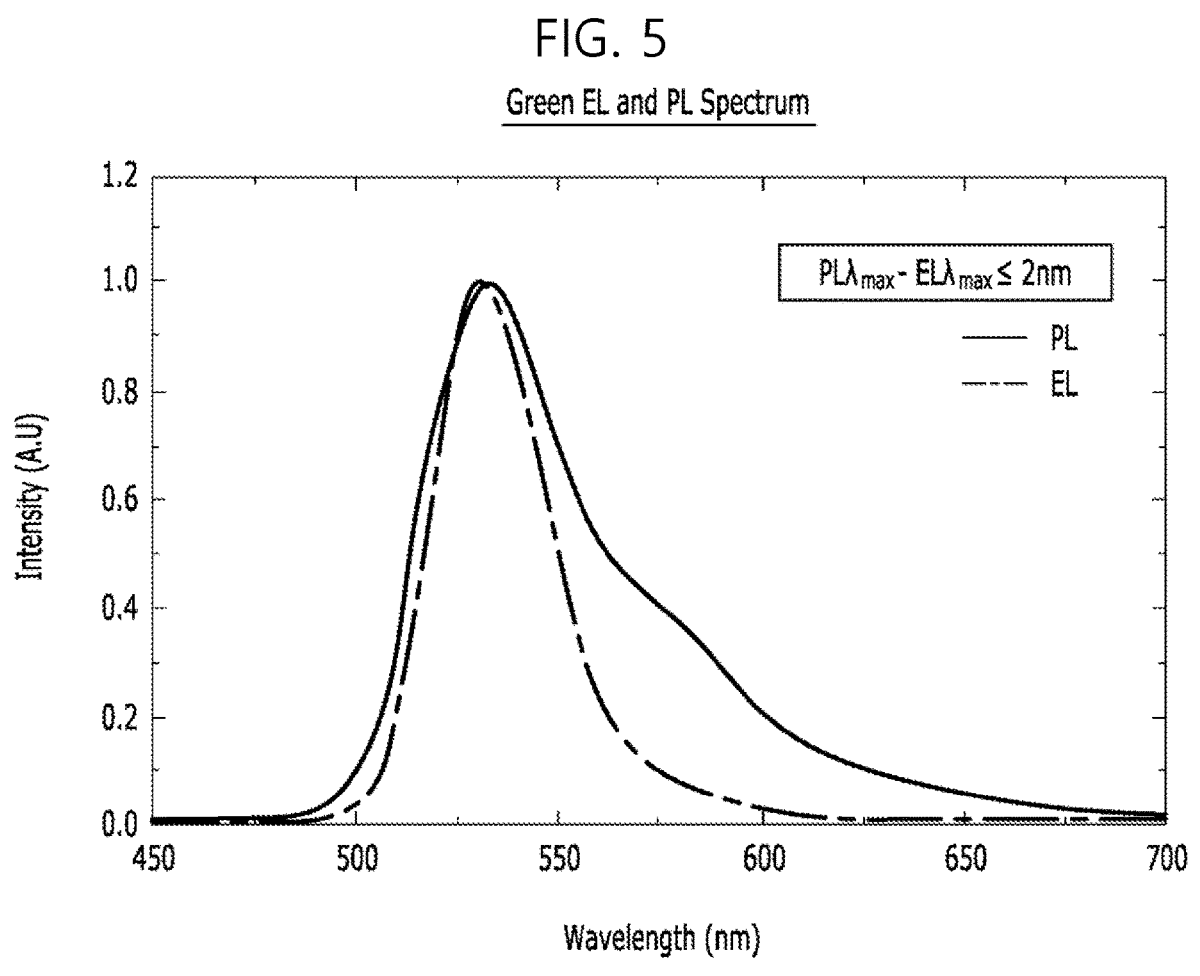
Figure 6:
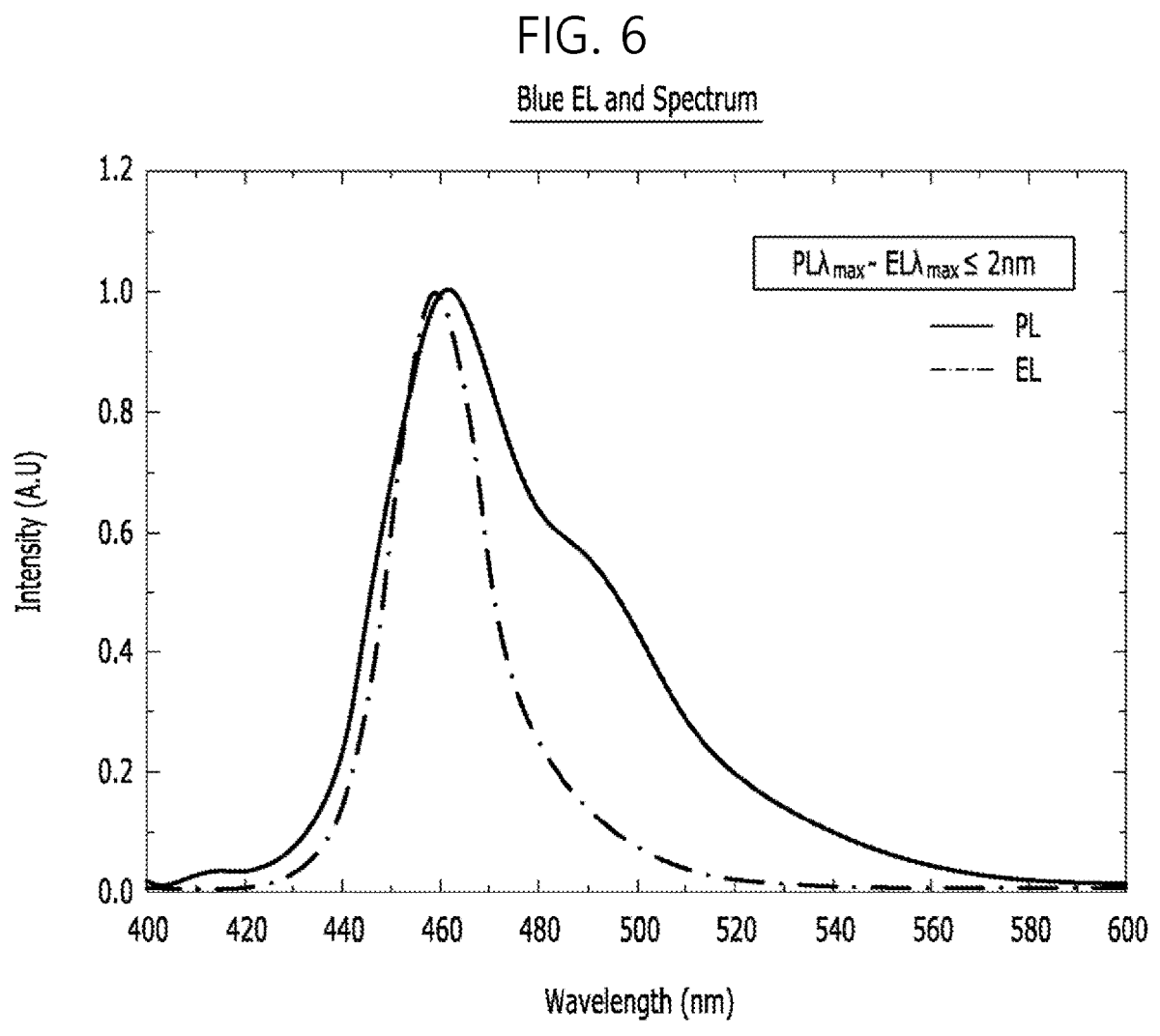

In more detail, as shown in FIG. 4, in the light emitting display device according to the present disclosure, the first wavelength difference (Red PL$\lambda$max–EL$\lambda$max) between the photoluminescence (PL) peak PL$\lambda$max of the red light emitting layer and the electroluminescence (EL) peak EL$\lambda$max of the red light emitting element is 2 nm or less. Also, as shown in FIG. 5, the second wavelength difference (Green PL$\lambda$max–EL$\lambda$max) between the photoluminescence (PL) peak PL$\lambda$max of the green light emitting layer and the electroluminescence (EL) peak EL$\lambda$max of the green light emitting element is 2 nm or less, and as shown in FIG. 6, the third wavelength difference (Blue PL$\lambda$max–EL$\lambda$max) between the photoluminescence (PL) peak PL$\lambda$max of the blue light emitting layer and the electroluminescence (EL) peak EL$\lambda$max of the blue light emitting element can be 2 nm or less. Thus, even though a viewer may look at the light emitting display device while changing the viewing angle, it is possible to reduce the color deviation for each emission color. In addition, it is possible to minimize the color viewing angle deviation in white light obtained by summing the red light, the green light, and the blue light.

Further, the photoluminescence (PL) spectrum of a light emitting layer is a characteristic determined by an inherent material (dopant and host) of the light emitting layer, and the electroluminescence (EL) spectrum of the light emitting element is calculated via the product of the curve of the photoluminescence (PL) spectrum and the curve of an outcoupling emittance spectrum determined depending on the thicknesses and materials of the organic layers included in the entire structure of the light emitting element.

For example, referring to FIG. 4, the red light emitting layer has a PL peak at a wavelength of about 610 nm to 625 nm, and the materials and thicknesses of the organic layers 131, 132, 143, 151, 152, 153, 154, 156, 163, and 171 included in the red light emitting element are adjusted to generate the EL spectrum of the red light emitting element having an electroluminescence (EL) peak at a difference in wavelength of 2 nm or less from the wavelength of the photoluminescence (PL) peak of the red light emitting layer. Each of the first and second red light emitting layers 143 and 163 can include a red phosphorescent dopant including a heavy metal, such as iridium or platinum, and can include at least one of a hole transportable host and an electron transportable host.

In addition, referring to FIG. 5, the green light emitting layer has a PL peak at a wavelength of about 525 nm to 540 nm, and the materials and thicknesses of the organic layers 131, 132, 142, 151, 152, 153, 154, 157, 162, and 171 included in the green light emitting element are adjusted to generate the EL spectrum of the green light emitting element having an electroluminescence (EL) peak at a difference in wavelength of 2 nm or less from the wavelength of the photoluminescence (PL) peak of the green light emitting layer. Each of the first and second green light emitting layers 142 and 162 can include a green phosphorescent dopant including a heavy metal, such as iridium or platinum, and can include at least one of a hole transportable host and an electron transportable host.

In addition, referring to FIG. 6, the blue light emitting layer has a PL peak at a wavelength of about 450 nm to 470 nm, and the materials and thicknesses of the organic layers 131, 132, 141, 151, 152, 153, 154, 161, and 171 included in the blue light emitting element are adjusted to generate the EL spectrum of the blue light emitting element having an electroluminescence (EL) peak at a difference in wavelength of 2 nm or less from the wavelength of the photoluminescence (PL) peak of the blue light emitting layer. Each of the first and second blue light emitting layers 141 and 161 can include a boron-based florescent or thermally activated delayed florescent (TADF) blue dopant, and can include at least one host.

Referring to FIG. 2, the common layers 131, 132, 151, 152, 153, 154, and 171 included in the blue light emitting element BED are commonly formed in the green light emitting element GED and the red light emitting element RED. Primarily, therefore, the difference in wavelength between the blue PL peak due to the materials of the first and second blue light emitting layers 141 and 161 and the blue EL peak due to the thicknesses and materials of the common layers 131, 132, 151, 152, 153, 154, and 171 is adjusted to 2 nm or less, and the thickness and ingredients of the light emitting layers 142/162 and 143/163 and the first and second hole transport auxiliary layers 156 and 157 of the green light emitting element GED and the red light emitting element RED are adjusted such that the difference in wavelength between the green PL peak and the green EL peak is 2 nm or less and the difference in wavelength between the red PL peak and the red EL peak is 2 nm or less.

Further, the first and second red light emitting layers 143 and 163, the first and second green light emitting layers 142 and 162, and the first and second blue light emitting layers 141 and 161 can have different thicknesses. In addition, the first and second hole transport auxiliary layers 156 and 157 can have different thicknesses.

In the light emitting display device 1000 shown in FIG. 3, a thin film transistor TFT is connected to the first electrode 120 of the light emitting element ED on the substrate 100. The substrate 100 can include at least one of glass, plastic film, and metal film.

Also, the light emitting element ED is connected to the thin film transistor TFT. As an example, as shown in FIG. 3, the thin film transistor TFT includes a semiconductor layer 103, a gate electrode 105 overlapping a channel of the semiconductor layer 103 with a gate dielectric film 104 interposed therebetween, and a source electrode 106 and a drain electrode 107 connected to the semiconductor layer 103.

The source electrode 106 or the drain electrode 107 can be connected to the first electrode 120. Further, the semiconductor layer 103 can include at least one of an oxide semiconductor, amorphous silicon, and crystalline silicon. A light blocking layer 101 can be further provided under the semiconductor layer 103 to prevent the semiconductor layer 103 from being affected by light incident from below the substrate 100.

A buffer layer 102 is further provided between the light blocking layer 101 and the semiconductor layer 103. An inorganic passivation film 108 and an organic passivation film 109 are sequentially formed to protect the thin film transistor TFT. As an example, each of the buffer layer 102 and the inorganic passivation film 108 can be any one of a silicon oxide film, a silicon nitride film, a silicon oxynitride film, a metal oxide film, and a metal nitride film. The organic passivation film 109 can also be made of an organic material, such as photo acrylic or BCB, and an upper surface thereof can be flat.

Further, in FIG. 3, the hole injection layer 131 and the first hole transport layer 132 of FIG. 2 are shown as a hole injection and transport unit 130, and the first electron transport layer 151, the charge generation layer CGL (152 and 153), and the second hole transport layer 154 are shown as a carrier transport unit 150. Each of the hole injection and transport unit 130, the carrier transport unit 150, and the second electron transport layer 171, which are common layers, can have a larger number of layers than the layers shown in FIG. 2.

In addition, the second electron transport layer 171 can further include an electron injection layer adjacent to the second electrode 175. Thus, when all of the red, green and blue light emitting elements are turned on to emit white light, the color visibility due to a viewing angle change is minimized in addition to a PL peak-EL peak characteristics of each light emitting element and light emitting layer.

Figure 7:
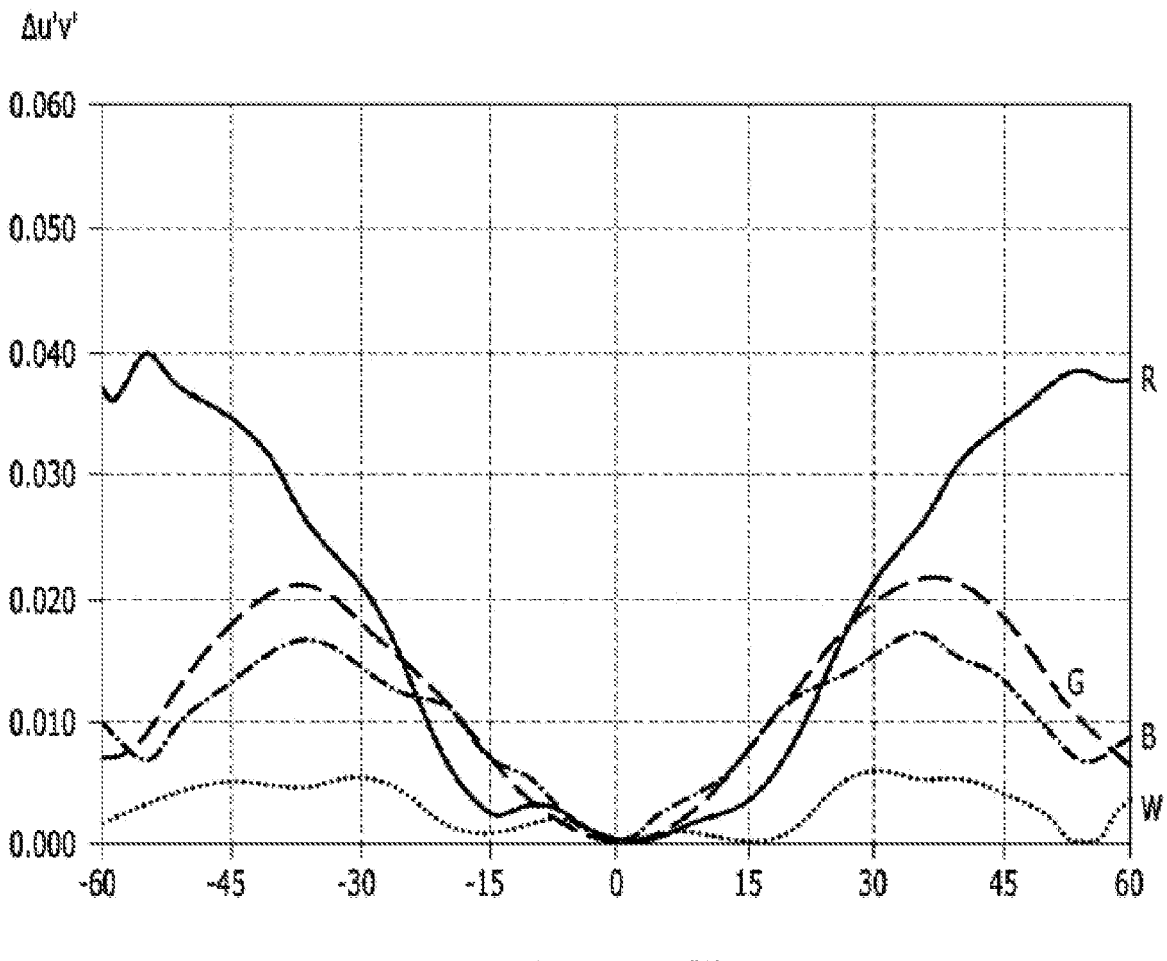
FIG. 7 is a graph showing the color viewing angle distance ($\Delta u'v'$) for each of emission colors (R, G, B, and W) depending on a viewing angle change in the light emitting display device according to an embodiment of the present disclosure.
Figure 8:
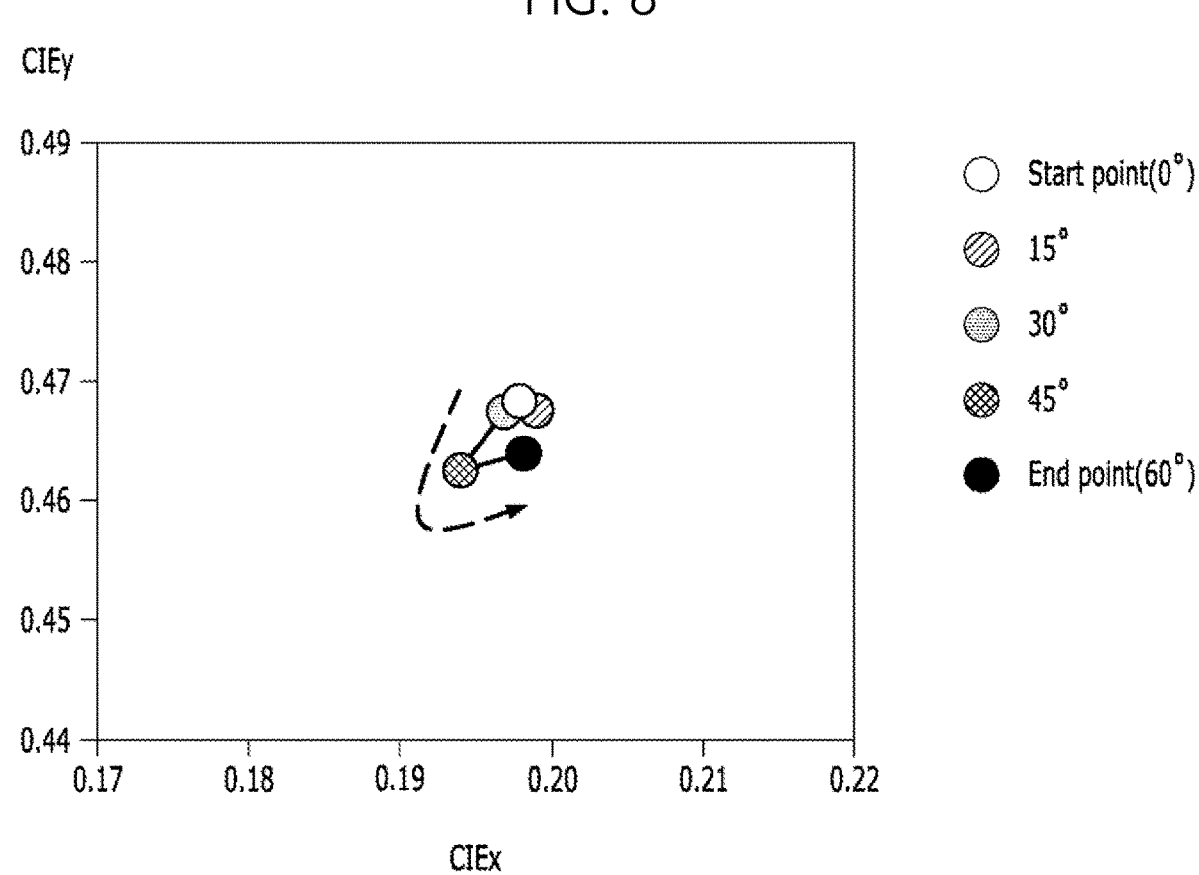
FIG. 8 is a graph showing color coordinates depending on viewing angle change in the light emitting display device according to an embodiment of the present disclosure.
Figure 9:
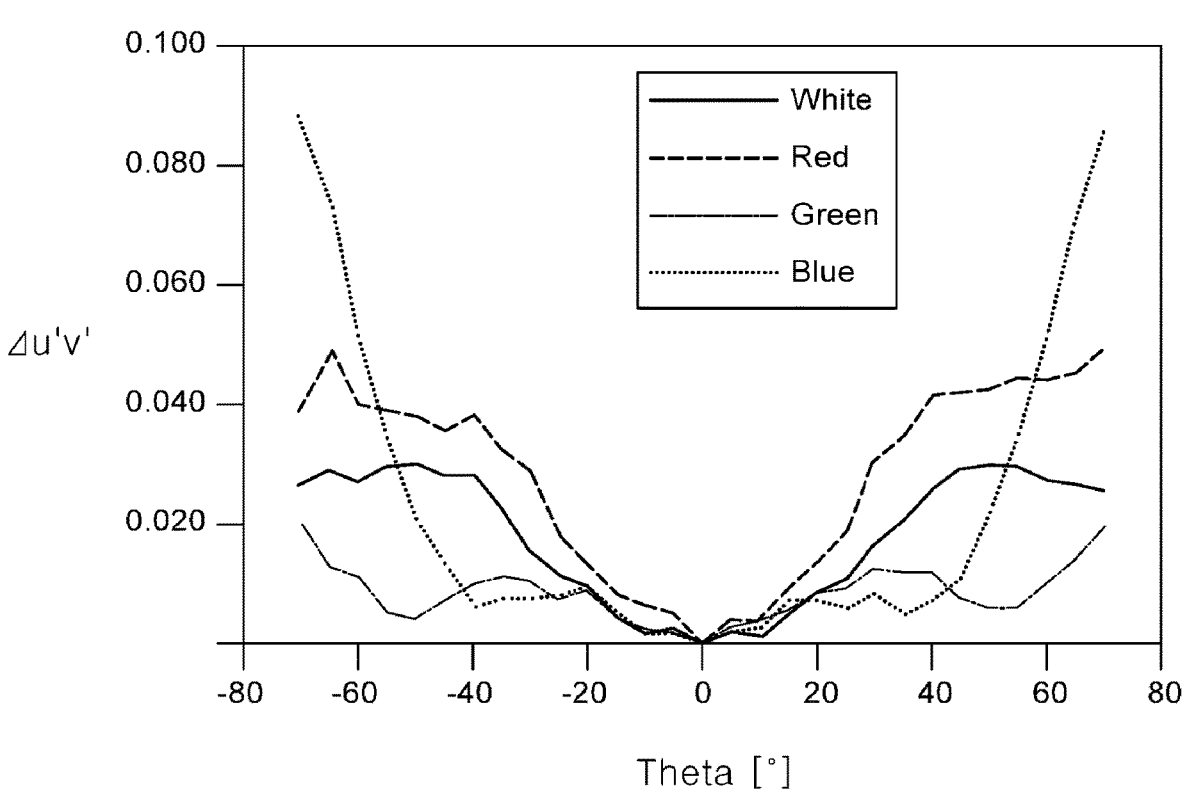
FIG. 9 is a graph showing the color viewing angle distance ($\Delta u'v'$) for each of emission colors (R, G, B, and W) depending on a viewing angle change in a light emitting display device according to a comparative example.

Next, FIG. 7 is a graph showing the color viewing angle distance Δu'v' for each emission color R, G, B, and W depending on a viewing angle change, and FIG. 8 is a graph showing color coordinates depending on a viewing angle change in the light emitting display device according to an embodiment of the present disclosure. In addition, FIG. 9 is a graph showing the color viewing angle distance Δu'v' for each emission color R, G, B, and W depending on a viewing angle change in a light emitting display device according to a comparative example.

TABLE 1

| Emission color | Classification First experimental example (Ex1) [FIG. 7] | |
| | (CIEx, CIEy) | $\Delta u'v'$ (0° to 60°) |
| --- | --- | --- |
| White | 0.3098, 0.3296 | 0.008 |
| Red | 0.693, 0.307 | 0.040 |
| Green | 0.250, 0.715 | 0.021 |
| Blue | 0.140, 0.047 | 0.017 |

When the red, green and blue light emitting elements are designed to have the PL peak-EL peak characteristics of FIGS. 4 to 6, the white light obtained by summing the red light from the red light emitting element, green light from the green light emitting element, and blue light from the blue light emitting element can have a color viewing angle distance W $\Delta u'v'$ of 0.010 or less at a viewing angle of 60° or less, as shown in FIG. 7 and Table 1. Further, among the first color viewing angle distance R $\Delta u'v'$ of red light from the red light emitting element, the second color viewing angle distance G $\Delta u'v'$ of green light from the green light emitting element, and the third color viewing angle distance B $\Delta u'v'$ of blue light from the blue light emitting element, the maximum value Rmax $\Delta u'v'$ of the first color viewing angle distance R $\Delta u'v'$ at a viewing angle of 60° or less can be the largest, and the maximum value Bmax $\Delta u'v'$ of the third color viewing angle distance B $\Delta u'v'$ at a viewing angle of 60° or less can be the smallest. That is, as shown in FIG. 7, the maximum value of the first color viewing angle distance, the maximum value of the second color viewing angle distance, and the maximum value of the third color viewing angle distance have a relationship of Rmax $\Delta u'v'$>Gmax $\Delta u'v'$>Bmax $\Delta u'v'$.

In addition, the maximum value Rmax $\Delta u'v'$ of the first color viewing angle distance is generated at a viewing angle of 45° to 60°, and each of the maximum value Gmax $\Delta u'v'$ of the second color viewing angle distance and the maximum value Bmax $\Delta u'v'$ of the third color viewing angle distance is generated at a viewing angle of 30° to 60°.

Further, each of the first color viewing angle distance R $\Delta u'v'$ of red light from the red light emitting element, the second color viewing angle distance G $\Delta u'v'$ of green light from the green light emitting element, and the third color viewing angle distance B $\Delta u'v'$ of blue light from the blue light emitting element can be greater than the fourth color viewing angle distance W $\Delta u'v'$ of white light obtained as the result of summation of red light from the red light emitting element, green light from the green light emitting element, and blue light from the blue light emitting element at the same viewing angle.

Also, among the first color viewing angle distance R $\Delta u'v'$ of red light from the red light emitting element, the second color viewing angle distance G $\Delta u'v'$ of green light from the green light emitting element, and the third color viewing angle distance B $\Delta u'v'$ of blue light from the blue light emitting element, the first color viewing angle distance R $\Delta u'v'$ can be largest and the third color viewing angle distance B $\Delta u'v'$ can be smallest at a viewing angle of 20° to 60°. Alternatively, the first color viewing angle distance R $\Delta u'v'$ can be greater than each of the second color viewing angle distance G $\Delta u'v'$ and the third color viewing angle distance B $\Delta u'v'$ at a viewing angle of 20° to 60°. In addition, the first color viewing angle distance R $\Delta u'v'$ can be less than each of the second color viewing angle distance G $\Delta u'v'$ and the third color viewing angle distance B $\Delta u'v'$ at a viewing angle of 0° to 20°.

When the EL peak-PL peak wavelength difference of each of the red light emitting element, the green light emitting element, and the blue light emitting element is 2 nm or less, as shown in FIGS. 4 to 6, and when the maximum values of the color viewing angle distances of the colors emitted from the light emitting elements are R>G>B, as shown in FIG. 7, the color viewing angle distance of white light obtained when light is emitted from all of the red light emitting element, the green light emitting element, and the blue light emitting element can be 0.010 or less. When white is implemented in the light emitting display device, therefore, the color deviation depending on the viewing angle change can be minimized and not be visible.

When EL$\lambda$max and PL$\lambda$max of light emitted from each light emitting element have a predetermined wavelength difference or less to implement a white color and the maximum values of the color viewing angle distances of the colors emitted from the light emitting elements are satisfied in order of R>G>B, the white viewing angle fluctuation can be reduced.

Next, FIG. 8 shows color coordinates of 15°, 30°, 45°, and 60° in a 1976 color coordinate system (u', v') when the viewing angle is incremented by 15° from 0° to implement a white color. Referring to FIG. 8, the difference between a start point of 0° and a viewing angle of 45° is greatest. As shown, an end point of 60° approaches a start point of 0°. This means that, when a white color is implemented in the light emitting display device according to an embodiment of the present disclosure, the color deviation is lower at a viewing angle of 60° than at a viewing angle of 45°.

Further, FIG. 7 and Table 1 illustrate that, when a white color is implemented to have a color viewing angle distance of 0.010 or less at a viewing angle of 60° or less, the viewer hardly recognizes color deviation.

TABLE 2

| Emission color | Classification First experimental example (Ex1) [FIG. 9] | |
| | (CIEx, CIEy) | $\Delta u'v'$(0° to 60°) |
| --- | --- | --- |
| White | 0.3098, 0.3296 | 0.025 |
| Red | 0.686, 0.313 | 0.044 |
| Green | 0.250, 0.720 | 0.012 |
| Blue | 0.140, 0.058 | 0.051 | to a comparative example in which, among red, green, and blue light emitting elements, the EL peak-PL peak wavelength difference of the blue light emitting element is greater than 2 nm, the color viewing angle distance $\Delta u'v'$ of blue is abruptly increased at a viewing angle of 40° or more, whereby the color viewing angle distance at a viewing angle of 60° exceeds 0.080, and the color viewing angle distance $\Delta u'v'$ of white is approximately 0.032 at a viewing angle of 40° or more, whereby color deviation is visible depending on viewing angle change during implementation of white.

Although each light emitting element of FIGS. 2 and 3 has a two-stack structure, the present disclosure is not limited thereto. To improve efficiency for each light emitting element, a charge generation layer and an additional stack can be further provided such that at least one of the light emitting elements is implemented so as to have three or more stacks.

In addition, as will be described below, even when a single stack light emitting element is provided, the EL peak-PL peak wavelength difference for each light emitting element of the present disclosure is defined, and the characteristics of the color viewing angle distance for each emission color are defined, whereby it is possible to minimize the color deviation depending on a viewing angle change and to prevent a color deviation visibility when a white color is implemented in the light emitting display device.

Figure 10:
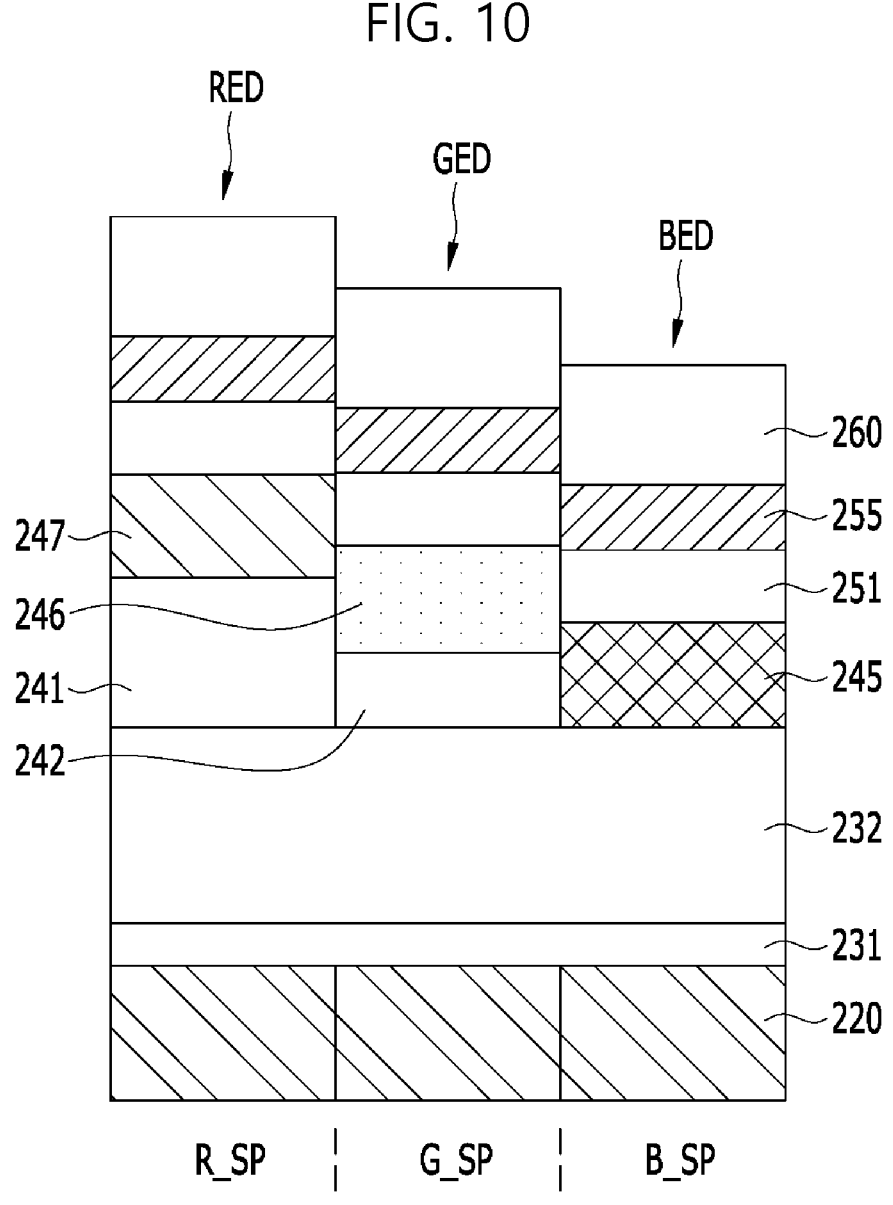
FIG. 10 is a sectional view showing light emitting elements of adjacent subpixels in a light emitting display device according to another embodiment of the present disclosure.

Next, FIG. 10 is a sectional view showing light emitting elements of adjacent subpixels in a light emitting display device according to another embodiment of the present disclosure. As shown in FIG. 10, each light emitting element can have a single stack structure.

That is, as shown in FIG. 10, the light emitting display includes a red light emitting element RED provided in a first subpixel R_SP, a green light emitting element GED provided in a second subpixel G_SP, and a blue light emitting element BED provided in a third subpixel B_SP. The red light emitting element RED includes a red light emitting layer 247, the green light emitting element GED includes a green light emitting layer 246, and the blue light emitting element BED includes a blue light emitting layer 245.

Each of the light emitting elements RED, GED, and BED can include the following common layers provided between first and second electrodes 220 and 255 in addition to a corresponding one of the light emitting layers 247, 246, and 245. That is, the common layers provided between the first and second electrodes 220 and 255 can include a hole injection layer 231, a hole transport layer 232, and an electron transport layer 251.

Specifically, the red light emitting element RED includes a hole injection layer 231, a hole transport layer 232, a first hole transport auxiliary layer 241, a red light emitting layer 247, and an electron transport layer 251 provided between the first and second electrodes 220 and 255. The green light emitting element GED includes a hole injection layer 231, a hole transport layer 232, a second hole transport auxiliary layer 242, a green light emitting layer 246, and an electron transport layer 251 provided between the first and second electrodes 220 and 255.

In addition, the blue light emitting element BED includes a hole injection layer 231, a hole transport layer 232, a blue light emitting layer 245, and an electron transport layer 251 provided between the first and second electrodes 220 and 255. The layers provided between the first electrode 220 and the second electrode 255 are referred to an intermediate layer OS, and each of the layers included in the intermediate layer OS can be formed to include an inorganic material. Some of the layers can include an inorganic material as a small amount of dopant for electron transportability, hole transportability, mobility, or light emission control.

Further, the red light emitting element RED, the green light emitting element GED, and the blue light emitting element BED have different vertical distances between the first electrode 220 and the second electrode 255, whereby outcoupling characteristics changed depending on the wavelength of each emission color are obtained. In more detail, to change the vertical distance between the first electrode 220 and the second electrode 255, each of the red light emitting element RED and the green light emitting element GED can include a first hole transport auxiliary layer 241 and a second hole transport auxiliary layer 242 having different thicknesses.

Further, the first electrode 220 can include a reflective electrode, and the second electrode 255 can be a translucent electrode or a transparent electrode. Also, a capping layer 260 configured to protect each of the light emitting elements RED, GED, and BED and to improve light emission efficiency can be further provided on the second electrode 255. An encapsulation layer can be further provided on the capping layer 260.

When light emitting elements provided in adjacent subpixels to include different color light emitting layers have different vertical distances between first and second electrodes, the difference in wavelength between the EL spectrum peak and the PL spectrum peak of each light emitting layer and a light emitting element corresponding thereto is reduced to a predetermined value or less, whereby the viewing angle volatility is solved. The difference in wavelength between the EL spectrum peak and the PL spectrum peak can be reduced by adjusting the material of the light emitting layer of each light emitting element and the materials and thickness included in the vertical distance between the first and second electrodes constituting the light emitting element. Further, the difference in wavelength between the EL spectrum peak and the PL spectrum peak can also be reduced by changing the thickness of at least one of the first electrode and the second electrode.

As is apparent from the above description, a light emitting display device according to the present disclosure has the following advantages.

When the EL peak-PL peak wavelength difference of each of a red light emitting element, a green light emitting element, and a blue light emitting element is 2 nm or less and when the maximum values of the color viewing angle distances of colors emitted from the light emitting elements are R>G>B, the color viewing angle distance of white light obtained when light is emitted from all of the red light emitting element, the green light emitting element, and the blue light emitting element is 0.010 or less. When a white color is implemented in the light emitting display device, therefore, the color deviation depending on a viewing angle change can be minimized and not be visible.

In addition, the vertical distance between a first electrode and a second electrode is changed for each light emitting element, whereby it is possible to prevent a color viewing angle fluctuation for white in a structure in which outcoupling characteristics are maximized, and therefore it is possible to improve vision irrespective of change in angle at which a viewer looks at a screen.

Furthermore, the thicknesses and materials of a light emitting layer and organic layers (common layers) included in the light emitting element are adjusted to adjust the difference in wavelength between the photoluminescence peak and the electroluminescence peak, whereby it is possible to manufacture a light emitting display device with improved reliability without addition of a separate material.

Consequently, the present disclosure has an environmental/social/governance (ESG) effect based on advantages of environmentally friendliness, low power consumption, and process optimization.

A light emitting display device according to one or more aspects of the present disclosure includes a substrate having a first subpixel, a second subpixel, and a third subpixel, a red light emitting element at the first subpixel, the red light emitting element comprising a red light emitting layer, a green light emitting element at the second subpixel, the green light emitting element comprising a green light emitting layer and a blue light emitting element at the third subpixel, the blue light emitting element comprising a blue light emitting layer. A first wavelength difference between a photoluminescence peak of the red light emitting layer and an electroluminescence peak of the red light emitting element can be 2 nm or less. A second wavelength difference between a photoluminescence peak of the green light emitting layer and an electroluminescence peak of the green light emitting element can be 2 nm or less. A third wavelength difference between a photoluminescence peak of the blue light emitting layer and an electroluminescence peak of the blue light emitting element can be 2 nm or less.

Further, white light obtained by summing the red light from the red light emitting element, the green light from the green light emitting element, and the blue light from the blue light emitting element can have a color viewing angle distance of 0.010 or less at a viewing angle of 60° or less.

In addition, among a first color viewing angle distance of red light from the red light emitting element, a second color viewing angle distance of green light from the green light emitting element, and a third color viewing angle distance of blue light from the blue light emitting element, at a viewing angle of 60° or less, a maximum value of the first color viewing angle distance can be largest and a maximum value of the third color viewing angle distance can be smallest.

Also, the maximum value of the first color viewing angle distance can be generated at a viewing angle of 45° to 60°. In addition, each of a maximum value of the second color viewing angle distance and the maximum value of the third color viewing angle distance can be generated at a viewing angle of 30° to 60°.

Further, at the same viewing angle, each of a first color viewing angle distance of red light from the red light emitting element, a second color viewing angle distance of green light from the green light emitting element, and a third color viewing angle distance of blue light from the blue light emitting element can be greater than a fourth color viewing angle distance of white light obtained as a result of summation of red light from the red light emitting element, green light from the green light emitting element, and blue light from the blue light emitting element.

Among a first color viewing angle distance of red light from the red light emitting element, a second color viewing angle distance of green light from the green light emitting element, and a third color viewing angle distance of blue light from the blue light emitting element, the first color viewing angle distance can be greater than each of the second color viewing angle distance and the third color viewing angle distance at a viewing angle of 20° to 60°.

Among a first color viewing angle distance of red light from the red light emitting element, a second color viewing angle distance of green light from the green light emitting element, and a third color viewing angle distance of blue light from the blue light emitting element, the first color viewing angle distance can be less than each of the second color viewing angle distance and the third color viewing angle distance at a viewing angle of 0° to 20°.

Each of the red light emitting element, the green light emitting element, and the blue light emitting element comprises a first electrode and a second electrode opposite each other. The red light emitting layer, the green light emitting layer, and the blue light emitting layer can be provided between the first electrode and the second electrode. The red light emitting element, the green light emitting element, and the blue light emitting element can also have different vertical distances between the first electrode and the second electrode.

Further, the red light emitting element, the green light emitting element, and the blue light emitting element can have different thicknesses.

A light emitting display device according to one or more aspects of the present disclosure can further comprise a capping layer on the second electrode. Also, the second electrode can comprise a translucent electrode, and the first electrode can comprise a reflective electrode.

In addition, the red light emitting layer can include a plurality of red light emitting layers overlapping each other at the first subpixel, and at least one common layer between the plurality of red light emitting layers. The green light emitting layer can include a plurality of green light emitting layers overlapping each other at the second subpixel, and the at least one common layer between the plurality of green light emitting layers. The blue light emitting layer can include a plurality of blue light emitting layers overlapping each other at the third subpixel, and the at least one common layer between the plurality of blue light emitting layers.

A light emitting display device according to one or more aspects of the present disclosure can also include a first hole transport auxiliary layer provided between an uppermost one of the plurality of red light emitting layers and the at least one common layer and a second hole transport auxiliary layer provided between an uppermost one of the plurality of green light emitting layers and the at least one common layer. At least one common layer can include an electron transport layer, a charge generation layer, and a hole transport layer.

Each of the red light emitting element, the green light emitting element, and the blue light emitting element can include a first electrode, a hole injection layer, a hole transport layer on the hole injection layer, an electron transport layer on the hole transport layer and a second electrode on the electron transport layer. Each of the red light emitting layer, the green light emitting layer, and the blue light emitting layer can be provided between the hole transport layer and the electron transport layer.

A light emitting display device according to one or more aspects of the present disclosure can also include a first hole transport auxiliary layer between the hole transport layer and the red light emitting layer and a second hole transport auxiliary layer between the hole transport layer and the green light emitting layer. The first hole transport auxiliary layer can be thicker than the second hole transport auxiliary layer.

While the embodiments of the present disclosure have been described with reference to the accompanying drawings, the present disclosure is not limited to the embodiments and can be embodied in various different forms, and those skilled in the art will appreciate that the present disclosure may be embodied in specific forms other than those set forth herein without departing from the technical idea and essential characteristics of the present disclosure. The disclosed embodiments are therefore to be construed in all aspects as illustrative and not restrictive.

What is claimed is:

1. A light emitting display device comprising:
   a substrate including a first subpixel, a second subpixel, and a third subpixel;
   a red light emitting element at the first subpixel, the red light emitting element comprising a red light emitting layer;
   a green light emitting element at the second subpixel, the green light emitting element comprising a green light emitting layer; and
   a blue light emitting element at the third subpixel, the blue light emitting element comprising a blue light emitting layer, wherein:
   a first wavelength difference between a photoluminescence peak and an electroluminescence peak of the red light emitting element is 2 nm or less, a second wavelength difference between a photolumines-cence peak and an electroluminescence peak of the green light emitting element is 2 nm or less, a third wavelength difference between a photolumines-cence peak and an electroluminescence peak of the blue light emitting element is 2 nm or less, and wherein white light obtained by summing the red light, the green light, and the blue light has a color viewing angle distance of 0.010 or less at a viewing angle of 60° or less.

2. The light emitting display device according to claim 1, wherein:

at a viewing angle of 60° or less, a maximum value of a first color viewing angle distance of red light from the red light emitting element is largest and a maximum value of a third color viewing angle distance of blue light from the blue light emitting element is smallest.

3. The light emitting display device according to claim 2, wherein:

the maximum value of the first color viewing angle distance is generated at a viewing angle of 45° to 60°, and each of a maximum value of the third color viewing angle distance and the maximum value of the third color viewing angle distance is generated at a viewing angle of 30° to 60°.

4. The light emitting display device according to claim 1, wherein at the same viewing angle, each of a first color viewing angle distance of red light from the red light emitting element, a second color viewing angle distance of green light from the green light emitting element, and a third color viewing angle distance of blue light from the blue light emitting element is greater than a fourth color viewing angle distance of white light obtained by summing the red light, the green light, and the blue light.

5. The light emitting display device according to claim 1, wherein:

a first color viewing angle distance of red light from the red light emitting element is greater than each of a second color viewing angle distance of green light from the green light emitting element and a third color viewing angle distance of blue light from the blue light emitting element at a viewing angle of more than 20° to 60°.

6. The light emitting display device according to claim 1, wherein:

a first color viewing angle distance of red light from the red light emitting element is less than each of a second color viewing angle distance of green light from the green light emitting element and a third color viewing angle distance of blue light from the blue light emitting element at a viewing angle of 0° to 20°.

7. The light emitting display device according to claim 1, wherein:

each of the red light emitting element, the green light emitting element, and the blue light emitting element further comprises a first electrode and a second elec-trode opposite each other, and the red light emitting layer, the green light emitting layer, and the blue light emitting layer are respectively pro-vided between the first electrode and the second elec-trode and have different vertical distances between the first electrode and the second electrode.

8. The light emitting display device according to claim 7, wherein the red light emitting element, the green light emitting element, and the blue light emitting element have different thicknesses.

9. The light emitting display device according to claim 7, further comprising:

a capping layer on the second electrode, wherein:

the second electrode comprises a translucent electrode, and the first electrode comprises a reflective electrode.

10. The light emitting display device according to claim 7, wherein:

the red light emitting layer comprises a plurality of red light emitting layers stacked over each other at the first subpixel, and at least one common layer therebetween, the green light emitting layer comprises a plurality of green light emitting layers stacked over each other at the second subpixel, with the at least one common layer therebetween, and the blue light emitting layer comprises a plurality of blue light emitting layers stacked over each other at the third subpixel, with the at least one common layer therebe-tween.

11. The light emitting display device according to claim 10, further comprising:

a first hole transport auxiliary layer provided between an uppermost one of the plurality of red light emitting layers and the at least one common layer; and a second hole transport auxiliary layer provided between an uppermost one of the plurality of green light emit-ting layers and the at least one common layer.

12. The light emitting display device according to claim 10, wherein the at least one common layer comprises an electron transport layer, a charge generation layer, and a hole transport layer.

13. The light emitting display device according to claim 1, wherein:

each of the red light emitting element, the green light emitting element, and the blue light emitting element comprises:

a first electrode;

a hole injection layer on the first electrode;

a hole transport layer on the hole injection layer;

an electron transport layer on the respective one of the red light emitting layer, the green light emitting layer and the blue light emitting layer; and a second electrode on the electron transport layer, and wherein each of the red light emitting layer, the green light emitting layer, and the blue light emitting layer is provided between the hole transport layer and the electron transport layer.

14. The light emitting display device according to claim 13, further comprising:

a first hole transport auxiliary layer between the hole transport layer and the red light emitting layer; and a second hole transport auxiliary layer between the hole transport layer and the green light emitting layer.

15. The light emitting display device according to claim 14, wherein the first hole transport auxiliary layer is thicker than the second hole transport auxiliary layer.

\* \* \* \* \*